United States Patent
Li et al.

(10) Patent No.: US 11,955,199 B2
(45) Date of Patent: Apr. 9, 2024

(54) MEMORY CHIP, MEMORY DEVICE AND OPERATION METHOD THEREOF

(71) Applicant: MACRONIX INTERNATIONAL CO., LTD., Hsinchu (TW)

(72) Inventors: Yung-Chun Li, New Taipei (TW); Yu-Ming Huang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 135 days.

(21) Appl. No.: 17/845,008

(22) Filed: Jun. 21, 2022

(65) Prior Publication Data
US 2023/0410856 A1  Dec. 21, 2023

(51) Int. Cl.
*G11C 7/10* (2006.01)

(52) U.S. Cl.
CPC .......... *G11C 7/1039* (2013.01); *G11C 7/1063* (2013.01); *G11C 7/1069* (2013.01); *G11C 7/109* (2013.01); *G11C 7/1096* (2013.01)

(58) Field of Classification Search
CPC .................................................. G11C 7/1039
See application file for complete search history.

(56) References Cited

U.S. PATENT DOCUMENTS

| | | | |
|---|---|---|---|
| 7,058,735 B2 | 6/2006 | Spencer | |
| 10,048,863 B1* | 8/2018 | Goss | G06F 3/0619 |
| 10,115,472 B1* | 10/2018 | Camp | G11C 16/3427 |
| 10,553,291 B2 | 2/2020 | Lee et al. | |
| 11,086,567 B2 | 8/2021 | Yang | |
| 11,099,781 B2 | 8/2021 | Yang | |
| 2017/0116075 A1* | 4/2017 | Yang | G06F 11/1068 |
| 2017/0177265 A1* | 6/2017 | Srinivasan | G06F 3/0604 |
| 2021/0349662 A1* | 11/2021 | Helm | G06F 3/0659 |
| 2022/0113896 A1 | 4/2022 | Ahn et al. | |

FOREIGN PATENT DOCUMENTS

| | | |
|---|---|---|
| CN | 109785887 A | 5/2019 |
| CN | 114327367 A | 4/2022 |
| TW | 202029189 A | 8/2020 |
| TW | 202131164 A | 8/2021 |

* cited by examiner

*Primary Examiner* — Douglas King
(74) *Attorney, Agent, or Firm* — McClure, Qualey & Rodack, LLP (57) ABSTRACT

A memory chip, a memory device and an operation method are disclosed. The memory chip includes a number of memory units and a control logic circuit. The memory units could be configured as TLC, MLC or SLC. The control logic circuit is configured to use TLC programming approach to program MLC and SLC.

15 Claims, 8 Drawing Sheets

MEMORY CHIP, MEMORY DEVICE AND OPERATION METHOD THEREOF

BACKGROUND

Field of the Disclosure

The invention relates to a memory chip, a memory device and an operation method thereof.

Related Art

3D NAND flash memory not only has array structure at XY plane, but also stereo stack structure in Z direction. Limited by manufacturing technique, the component characteristics of the memory units located at ends (i.e., top and bottom) in Z direction are generally worse than those of the memory units located in the middle. The component characteristics would affect the reliability of the data stored in the memory units. Therefore, the memory units located at the ends in Z direction would generally be configured to store less bits per memory unit than the memory units located in the middle. Conventionally, the memory device needs to configure multiple sets of circuits to correspond to the programming of different bit numbers written into the memory cells, which is a waste of space.

SUMMARY

An embodiment of the present disclosure discloses a memory device. The memory device comprises a memory controller and a memory chip. The memory controller is configured to receive a write request and a first data from a host controller, and transmit a write command indicating a first parameter. The first parameter represents the number of bits of binary data to be written into one memory unit. The memory chip is coupled to the memory controller. The memory chip comprises a memory array, at least one buffer and a control logic circuit. The memory array, comprises a plurality of memory units. Each of the memory units is configured to store at most N bits of binary data, wherein N is an integer greater than 1. The control logic circuit is coupled to the memory array and the at least one of buffer, and configured to perform: in response to the write command, when the first parameter is K which is an positive integer smaller than N, configuring the first data as sub-data every K bit(s), generating a (N−K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N−K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

Another embodiment of the present disclosure discloses an operation method of memory device, comprising: receiving a write request and a first data from a host controller; transmitting a write command indicating a first parameter, wherein the first parameter represents the number of bits of binary data to be written into one memory unit, each memory unit is configured to store at most N bits of binary data, and N is an integer greater than 1; in response to the write command, when the first parameter is K which is an positive integer smaller than N, configuring the first data as sub-data every K bit(s), generating a (N−K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N−K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

Yet another embodiment of the present disclosure discloses a memory chip. The memory chip comprises a memory array, at least one buffer and a control logic circuit. The memory array, comprises a plurality of memory units. Each of the memory units is configured to store at most N bits of binary data, wherein N is an integer greater than 1. The control logic circuit is coupled to the memory array and the at least one of buffer, and configured to perform: receiving a write command and a first data from a memory controller, wherein the write command indicates a first parameter, the first parameter represents the number of bits of binary data to be written into one memory unit; in response to the write command, when the first parameter is K which is an positive integer smaller than N, configuring the first data as sub-data every K bit(s), generating a (N−K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N−K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

The above and other aspects of the invention will become better understood with regard to the following detailed description of the preferred but non-limiting embodiment(s). The following description is made with reference to the accompanying drawings.

DETAILED DESCRIPTION

Figure 1:
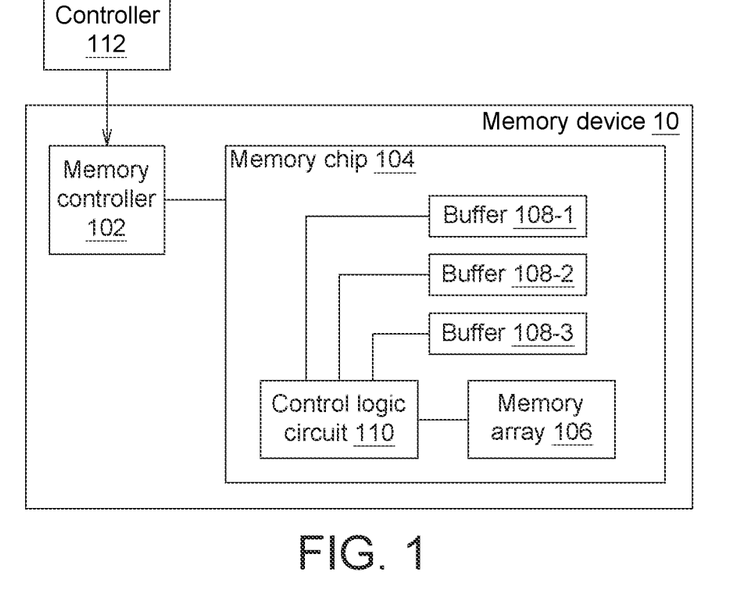
FIG. 1 shows a block diagram of memory device according to an embodiment of the present disclosure.

Referring to FIG. 1, FIG. 1 shows a block diagram of memory device according to an embodiment of the present disclosure. The memory device 10 includes a memory controller 102 and one or more memory chips 104. The memory controller 102 is configured to be coupled to an external host controller (not shown), wherein the host controller could be a central control unit (CPU). The memory chip 104 is coupled to the memory controller 102.

The memory chip 104 includes a memory array 106, three buffers 108-1~108-3 and a control logic circuit 110. The memory array 106 could be a 3D NAND flash memory. The buffers 108-1~108-3 could be latches. The control logic circuit 110 is coupled to the memory controller 102, the memory array 106 and the buffers 108-1~108-3. The control logic circuit 110 could include an equivalent circuit of finite state machine corresponding to programing of triple level cell (TLC).

The memory array 106 could include a number of pages. Each of the pages could include a number of memory units (not shown). Each of the memory units could be configured to store at most three bits of binary data. That is, the memory unit could be configured as single level cell (SLC), multi level cell (MLC) or TLC. The memory unit configured as SLC (hereafter, SLC memory unit) could store one bit of binary data, for example, 0, 1. The memory unit configured as MLC (hereafter MLC memory unit) could store two bits of binary data, for example, 00, 01, 10, 11. The memory unit (hereafter, TLC memory unit) could store three bits of binary data, for example, 000, 001, 010, 011, 100, 101, 110, 111.

Conventionally, the memory chip would generally configure three independent sets of control logic circuits to correspond respectively to the programming of SLC memory units, MLC memory units and TLC memory units.

In an embodiment of the present disclosure, based on the control logic circuit for programming TLC memory unit, with the mechanism described below, using the control logic circuit for programming TLC memory unit to program MLC memory unit and SLC memory unit could be achieved.

Figure 2:
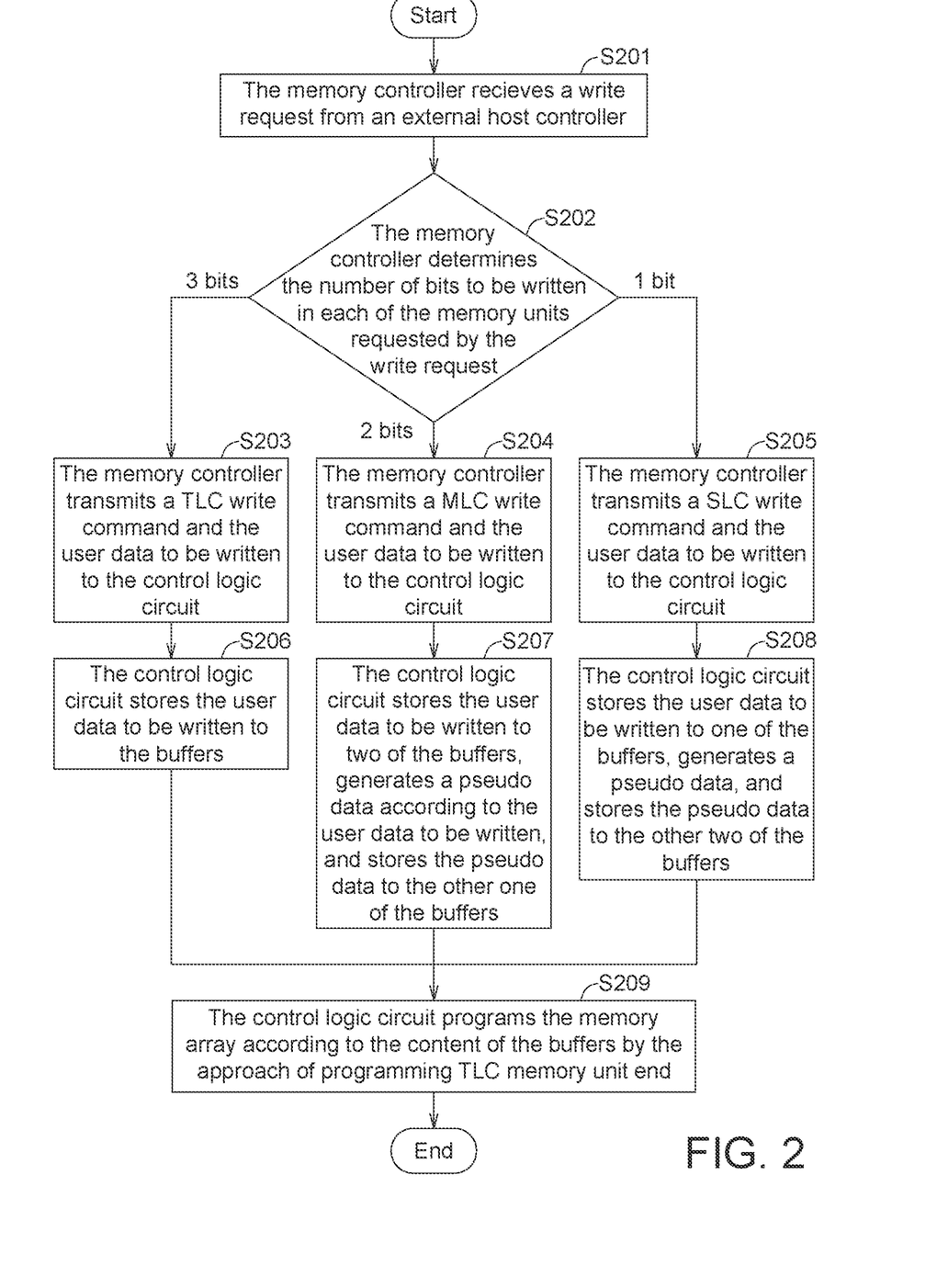
FIG. 2 shows a flowchart of operation method of memory device according to an embodiment of the present disclosure.

Referring to FIG. 2, FIG. 2 a flowchart of operation method of memory device according to an embodiment of the present disclosure.

At step S201, the memory controller 102 receives a write request and first data to be written from the host controller. The write request includes a first parameter. The first parameter represents the number of bits to be written in one memory unit. The first data to be written could be one or more bits of binary data.

At step S202, the memory controller 102 determines the number of bits to be written in one memory unit, that is, the first parameter.

If the first parameter is 3 (the memory unit(s) is configured as TLC), performing step S203, the memory controller 102 a TLC write command which indicates the first parameter is 3, and transmits the first data to be written to the control logic circuit 110.

If the first parameter is 2 (the memory unit(s) is configured as MLC), performing step S204, the memory controller 102 a MLC write command which indicates the first parameter is 2, and transmits the first data to be written to the control logic circuit 110.

If the first parameter is 1 (the memory unit(s) is configured as SLC), performing step S205, the memory controller 102 a TLC write command which indicates the first parameter is 1, and transmits the first data to be written to the control logic circuit 110.

Figure 3:
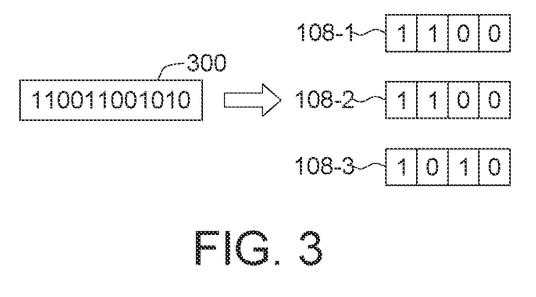
FIGS. 3-5 show schematic diagrams of storing the first data to the buffer.

At step S206 (case: TLC), the control logic circuit 110 stores the first data to be written into the buffers 108-1~108-3. As shown in FIG. 3, the first data 300 to be written is 110011001010, with a total of twelve bits. The control logic circuit 110 configures the first data 300 as sub-data every three bits from left to right. The first data to be written could be configured as 110, 011, 001, 010, with a total of four sub-data. Each of the sub-data would need one TLC memory unit to store, and a total of four TLC memory units would be needed to store the first data. The first data 110011001010 would be divided into 1100, 1100 and 1010, and respectively stored into the buffers 108-1, 108-2 and 108-3.

Figure 4:
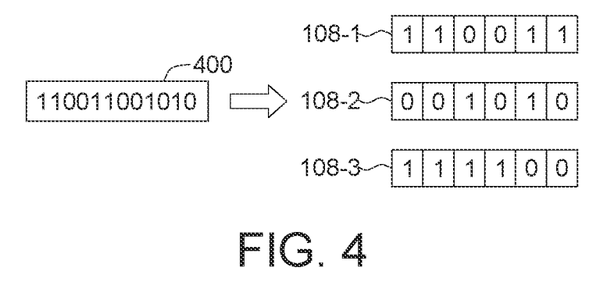

At step S207 (case: MLC), the control logic circuit 110 stores the first data into two of the buffers 108-1~108-3, generates pseudo data according to the first data to be written, and stores the pseudo data into the other one of the buffers 108-1~108-3. As shown in FIG. 4, the first data 400 to be written is 110011001010, with a total of twelve bits. The control logic circuit 110 configures the first data 400 as sub-data from left to right every two bits. The first data to be written could be configured as 11, 00, 11, 00, 10, 10, with a total of six sub-data. Each of the sub-data would need one MLC memory unit to store, and a total of six MLC memory units would be needed to store the first data. The first data 110011001010 would be divided into 110011 and 001010, and respectively stored into the buffers 108-1 and 108-2. In this embodiment, the control logic circuit 110 inputs each of the sub-data into a XNOR logical gate to generate the pseudo data. The six sub-data 11, 00, 11, 00, 10, 10 are respectively input into the XNOR gate to generate the pseudo data. Taking the first sub-data 11 as an example, 1 would be obtained by performing XNOR operation with 1 and 1, and so on. With this approach, pseudo data 1, 1, 1, 1, 0, 0 corresponding to the six sub-data 11, 00, 11, 00, 10, 10 could be generated. The generated sub-data 111100 would be stored into the buffer 108-3.

Noted that the XNOR logical gate is generally an inherent component of the control logic circuit 110 or other circuit of the memory chip 104. Therefore, no additional cost and space would be needed.

Figure 5:
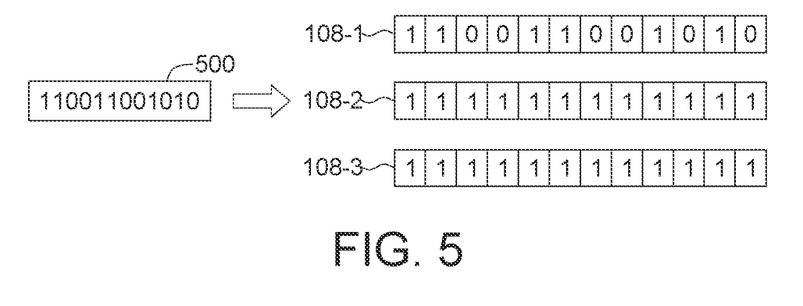

At step S208 (case: SLC), the control logic circuit 110 stores the first data into one of the buffers 108-1~108-3, generates pseudo data, and stores the pseudo data into the other two of the buffers 108-1~108-3. As shown in FIG. 5, the first data 500 to be written is 110011001010, with a total of twelve bits. The control logic circuit 110 configures the first data 400 as sub-data from left to right every one bit, with a total of twelve sub-data. Each of the sub-data would need one SLC memory unit to store, and a total of twelve SLC memory units would be needed to store the first data. The control logic circuit 110 stores the sub-data into the buffer 108-1, and generates two-bit pseudo data 11 corresponding to each of the sub-data. The two bits of each of the pseudo data would be stored into the buffers 108-2, 108-3 respectively.

At step S209, the control logic circuit 110 programs the memory array 106 with the approach of programming TLC memory unit according to the content of the buffers 108-1~108-3. Noted that no matter the target memory unit to be programmed is SLC, MLC or TLC, in step S209, the approach for programming TLC memory unit would be used. The principle would be describe below.

The first thing to note is that, "programming" is to inject electrons into the memory unit by applying programming bias to the memory unit to modify the threshold voltage of the memory unit so that the threshold voltage of the memory unit would fall within one of multiple voltage ranges, wherein different voltage ranges represent different data patterns. "Reading" is to apply one or more rounds of read bias to the memory unit, and to determine which voltage range the threshold voltage of the memory unit falls in by observing whether the memory unit allows current to pass through so that the stored data pattern could be determined.

Figure 6:
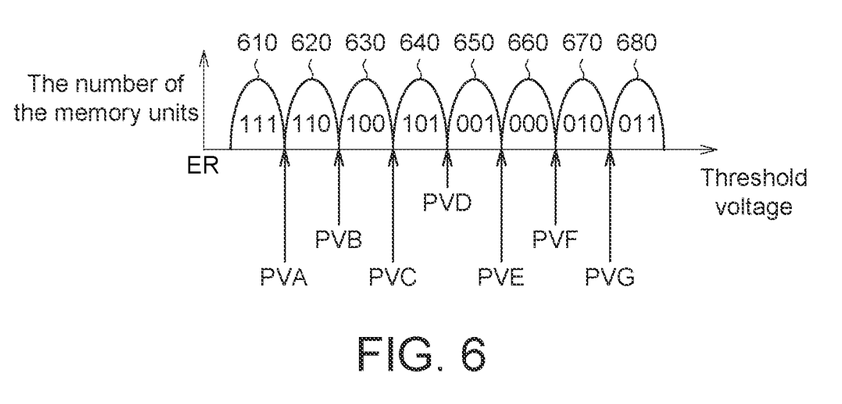
FIG. 6 shows a schematic diagram of the data stored in TLC memory unit and the distributions of threshold voltage according to an embodiment of the present disclosure.

Referring to FIG. 6, FIG. 6 shows a schematic diagram of the data stored in TLC memory unit and the distributions of threshold voltage according to an embodiment of the present disclosure. One TLC memory unit could store three bits of binary data. The data patterns formed by three bits of binary data include 000, 001, 010, 011, 100, 101, 110 and 111. Eight voltage ranges ER~PVA, PVA~PVB, PVB~PVC, PVC~PVD, PVD~PVE, PVE~PVF, PVF~PVG, and greater than PVG one-to-one correspond to the eight data patterns. For example, the voltage range ER~PVA corresponds to 111, the voltage range PVA~PVB corresponds to 110, and so on, wherein ER is the initial voltage, that is, the voltage of which the memory unit is erased. In the present disclosure, please follow the same analogy for the correspondence between the voltage ranges and the data patterns in FIGS. 7-12. The distributions 610 represents the distribution of the threshold voltages of a specific number of TLC memory units being programmed within the voltage range ER~PVA. The distributions 620 represents the distribution of the threshold voltages of a specific number of TLC memory units being programmed within the voltage range PVA~PVB, and so on. By modifying the threshold voltage of the TLC memory unit to cause the threshold voltage of the TLC memory unit to fall within one of the eight voltage ranges (could be considered as falling in one of the distributions 61ER~680), it represents that the programmed TLC memory unit stores the data corresponding to the voltage range (the distribution). When reading, the control logic circuit 110 applies three rounds of read bias to determine which voltage range the threshold voltage of the TLC memory unit falls in to determine the stored data. The read bias applied in the first round is PVD for determining the MSB. The read bias applied in the second round are PVB and PVF for determining the middle bit. The read bias applied in the third round are PVA, PVC, PVE and PVG for determining the LSB. Taking the example in FIG. 3, at step S209, the control logic circuit 110 programs a first TLC memory unit according to a first sub-data (i.e., 110) in the buffers 108-1~108-3 to cause the threshold voltage of the first TLC memory unit to fall within the voltage range PVA~PVB, programs a second TLC memory unit according to a second sub-data (i.e., 011) in the buffers 108-1~108-3 to cause the threshold voltage of the second TLC memory unit to fall within the voltage range greater than PVG, and so on.

Figure 7:
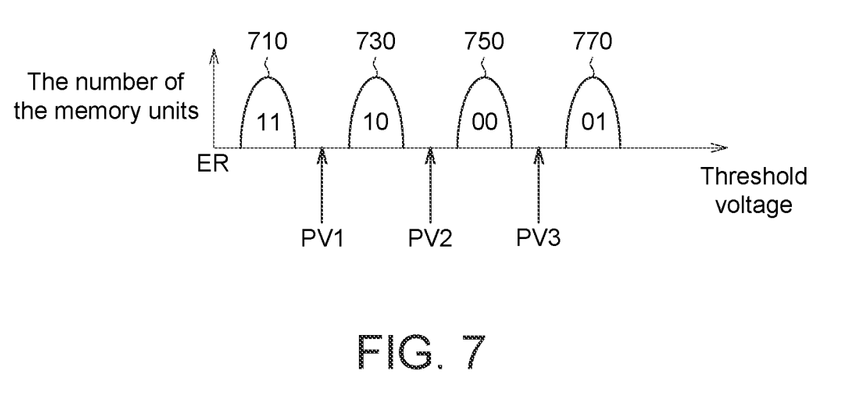
FIG. 7 shows a schematic diagram of the data stored in MLC memory unit and the distributions of threshold voltage according to an embodiment of the present disclosure.

Referring to FIG. 7, FIG. 7 shows a schematic diagram of the data stored in MLC memory unit and the distributions of threshold voltage according to an embodiment of the present disclosure. One MLC memory unit could store two bits of binary data. The data patterns formed by two bits of binary data include 00, 01, and 11. When programming MLC memory unit, four voltage ranges would be selected from the eight voltage ranges for programming TLC memory unit to one-to-one correspond to the four data patterns formed by two bits of binary data. In this embodiment, the voltage ranges ER~PVA, PVB~PVC, PVD~PVE and PVF~PVG are selected. The function of the pseudo data is to add one bit to each of the two-bit sub-data to form a three-bit data, which is suitable for the operation of TLC programming. Taking the example in FIG. 4, at step S209, the control logic circuit 110 programs a first MLC memory unit according to a combination of a first sub-data and the pseudo data (i.e., 111) in the buffers 108-1~108-3 to cause the threshold voltage of the first MLC memory unit to fall within the voltage range ER~PVA, programs a second MLC memory unit according to a combination of a second sub-data and the pseudo data (i.e., 001) in the buffers 108-1~108-3 to cause the threshold voltage of the second MLC memory unit to fall within the voltage range PVD~PVE, and so on. When designing the pseudo data, the correspondence between the four data patterns formed by two-bit binary data and the selected four voltage ranges could be determined first. Next, find out the difference between each of the two-bit data patterns and the three-bit data pattern corresponding to the corresponding voltage range. And then, determine the pseudo data corresponding to each of the two-bit data patterns according to the difference. When reading, the control logic circuit 110 applies two rounds of read bias to determine which voltage range the threshold voltage of the MLC memory unit falls in to determine the stored data. The read bias applied in the first round is PVD for determining the MSB. The read bias applied in the second round are PVB and PVF for determining the LSB.

Figure 8:
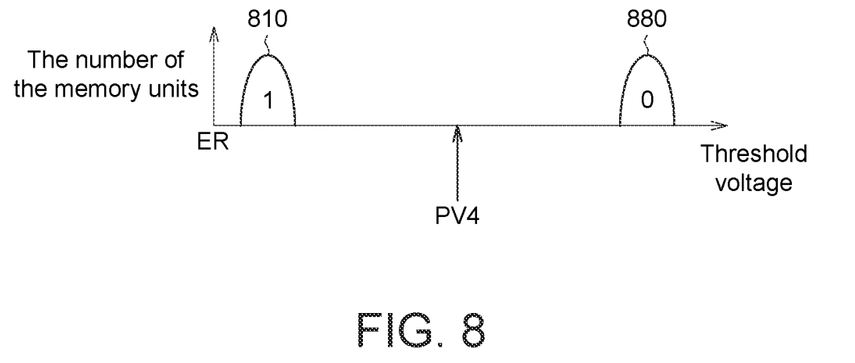
FIG. 8 shows a schematic diagram of the data stored in SLC memory unit and the distributions of threshold voltage according to an embodiment of the present disclosure.

Referring to FIG. 8, FIG. 8 shows a schematic diagram of the data stored in SLC memory unit and the distributions of threshold voltage according to an embodiment of the present disclosure. One SLC memory unit could store one bit of binary data. The data patterns formed by one bit of binary data include 0 and 1. When programming SLC memory unit, two voltage ranges would be selected from the eight voltage ranges for programming TLC memory unit to one-to-one correspond to the two data patterns formed by one bit of binary data. In this embodiment, the voltage ranges ER~PVA and greater than PVG are selected. The function of the pseudo data is to add two bits to each of the one-bit sub-data to form a three-bit data, which is suitable for the operation of TLC programming. Taking the example in FIG. 5, at step S209, the control logic circuit 110 programs a first SLC memory unit according to a combination of a first sub-data and the pseudo data (i.e., 111) in the buffers 108-1~108-3 to cause the threshold voltage of the first SLC memory unit to fall within the voltage range ER~PVA, programs a second SLC memory unit according to a combination of a second sub-data and the pseudo data (i.e., 111) in the buffers 108-1~108-3 to cause the threshold voltage of the second SLC memory unit to fall within the voltage range ER~PVA, and so on. When designing the pseudo data, the correspondence between the two data patterns formed by one-bit binary data and the selected two voltage ranges could be determined first. Next, find out the difference between each of the one-bit data patterns and the three-bit data pattern corresponding to the corresponding voltage range. And then, determine the pseudo data corresponding to each of the one-bit data patterns according to the difference. When reading, the control logic circuit 110 applies one round of read bias, that is PVD, for determining the stored data.

Figure 9:
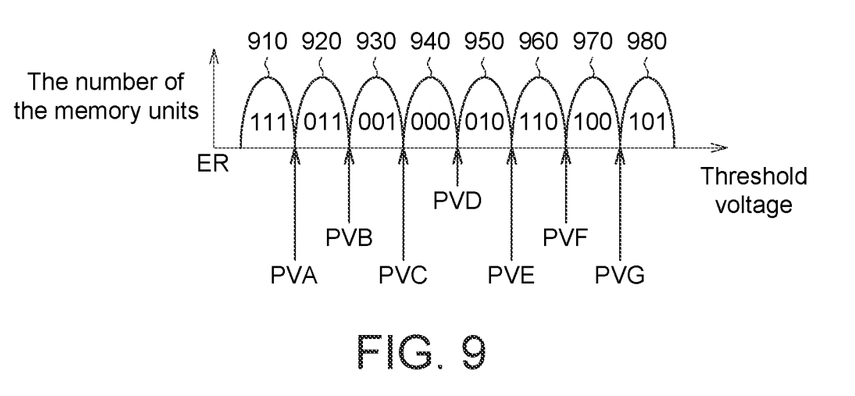
FIG. 9 shows a schematic diagram of the data stored in TLC memory unit and the distributions of threshold voltage according to another embodiment of the present disclosure.
Figure 10:
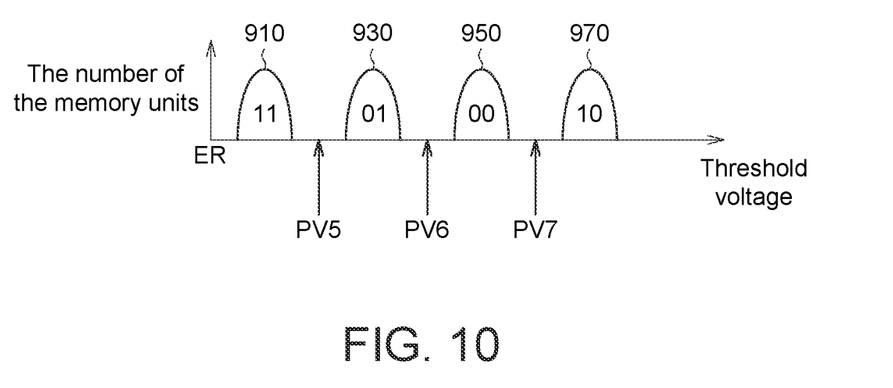
FIG. 10 shows a schematic diagram of the data stored in MLC memory unit and the distributions of threshold voltage according to another embodiment of the present disclosure.
Figure 11:
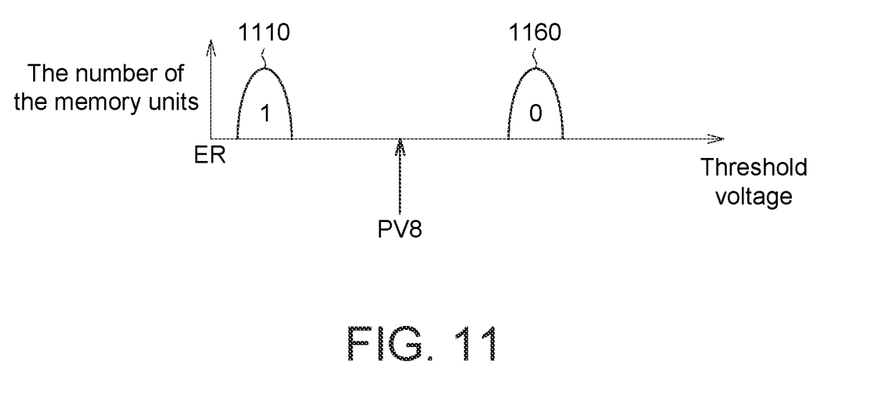
FIG. 11 shows a schematic diagram of the data stored in SLC memory unit and the distributions of threshold voltage according to another embodiment of the present disclosure.
Figure 12:
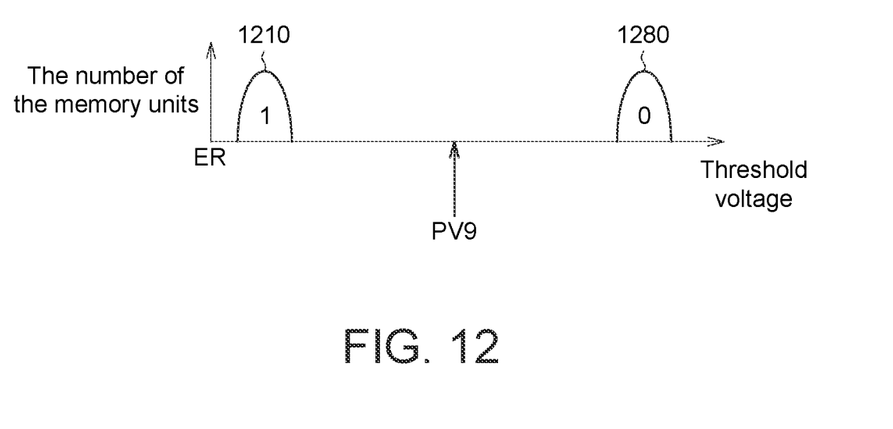
FIG. 12 shows a schematic diagram of the data stored in SLC memory unit and the distributions of threshold voltage according to yet another embodiment of the present disclosure.

Referring to FIG. 9, FIG. 9 shows a schematic diagram of the data stored in TLC memory unit and the distributions of threshold voltage according to another embodiment of the present disclosure. For the convenience of description, the distribution of the would be used to represent the corresponding voltage range. For example, the distribution 910 would be used to represent the voltage range ER~PVA, the distribution 920 would be used to represent the voltage range PVA~PVB, and so on. In this embodiment, when programming MLC memory unit, the distributions 910, 930, 950, 970 are selected to correspond to 00, 01, 10, 11, as shown in FIG. 10. The buffer 108-1 is configured to store the MSB of each of the sub-data, the buffer 108-3 is configured to store the LSBN of each of the sub-data, and the buffer 108-2 is configured to store the one-bit pseudo data corresponding to each of the sub-data, wherein the pseudo data is generated by performing XNOR operation with each of the two-bit sub-data. When programming SLC memory unit, the distributions 910, 960 are selected to correspond to 0 and 1, as shown in FIG. 11. The buffer 108-3 is configured to store the sub-data, and the buffers 108-1, 108-2 are configured to store the two-bit pseudo data corresponding to the sub-data. In FIG. 11, each of the sub-data is used as the LSB of the three-bit data required by using the TLC programming approach, and the two-bit pseudo data corresponding to each of the sub-data is used as the MSB and the middle bit of the three-bit data required by using the TLC programming approach. Noted that depending on the distribution selected, the position substituted by the pseudo data may be different. As shown in FIG. 12, in an alternative embodiment, when programming SLC memory unit, the distributions 910, 980 are selected to correspond to 0 and 1. In the alternative embodiment, the buffer 108-2 is configured to store the sub-data which is used as the middle bit of the three-bit data required by the TLC programming approach, and the buffers 108-1, 108-3 are configured to store the pseudo data which is used as the MSB and the LSB of the three-bit data required by the TLC programming approach.

In different embodiments, the memory unit could further be configured as quad level cell (QLC) or a cell with higher level. The present disclosure could be applied to these embodiments. In a general embodiment, one memory unit could be configured to store at most N bits of binary data, wherein N is an integer greater than 1. The operation method in FIG. 2 could be used for the general embodiment with modification.

Figure 13:
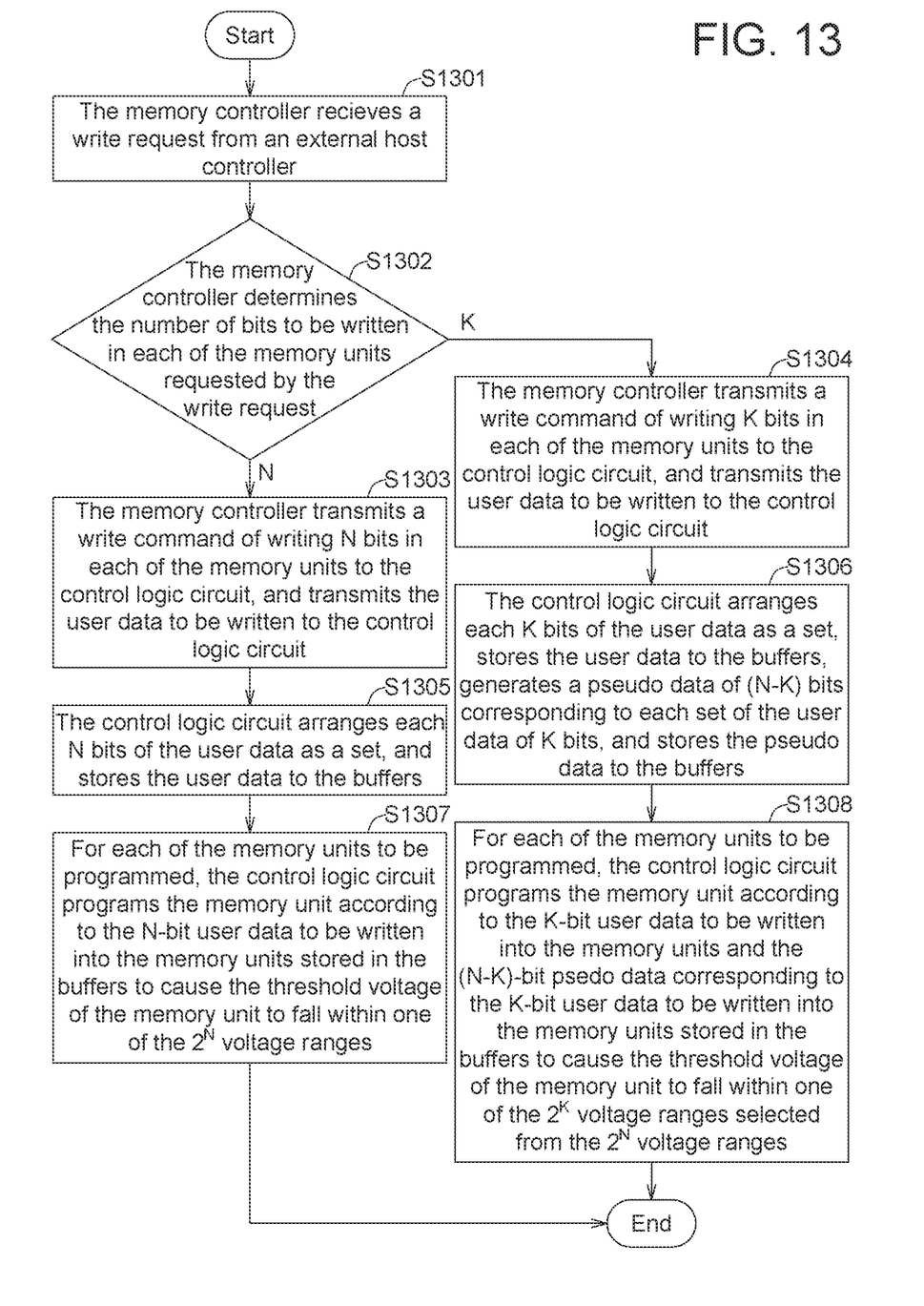
FIG. 13 shows a flowchart of operation method of memory device according to another embodiment of the present disclosure.
Figure 14:
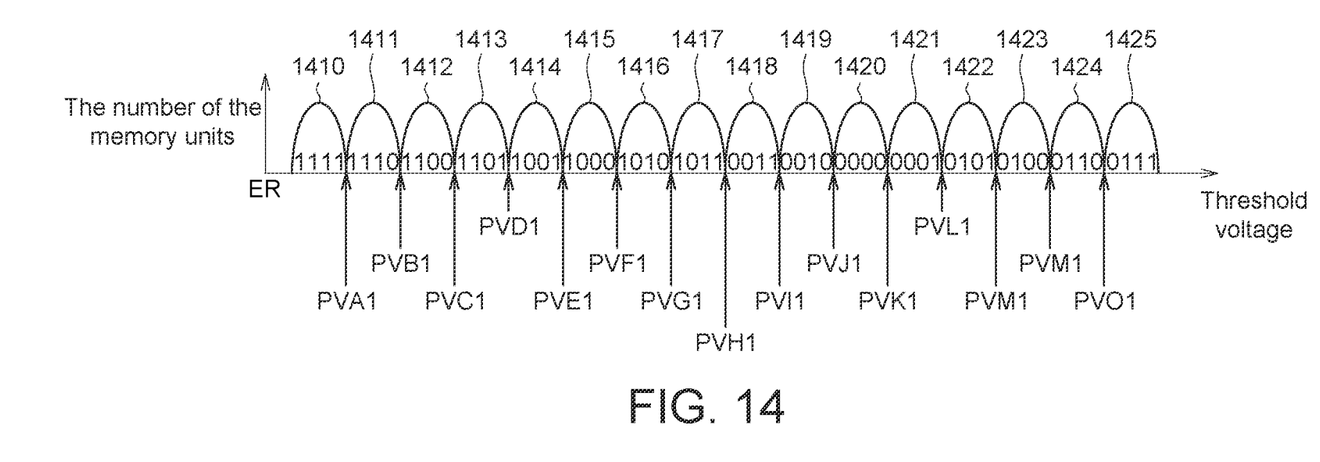
FIG. 14 shows a schematic diagram of the data stored in QLC memory unit and the distributions of threshold voltage according to yet another embodiment of the present disclosure.
Figure 15:
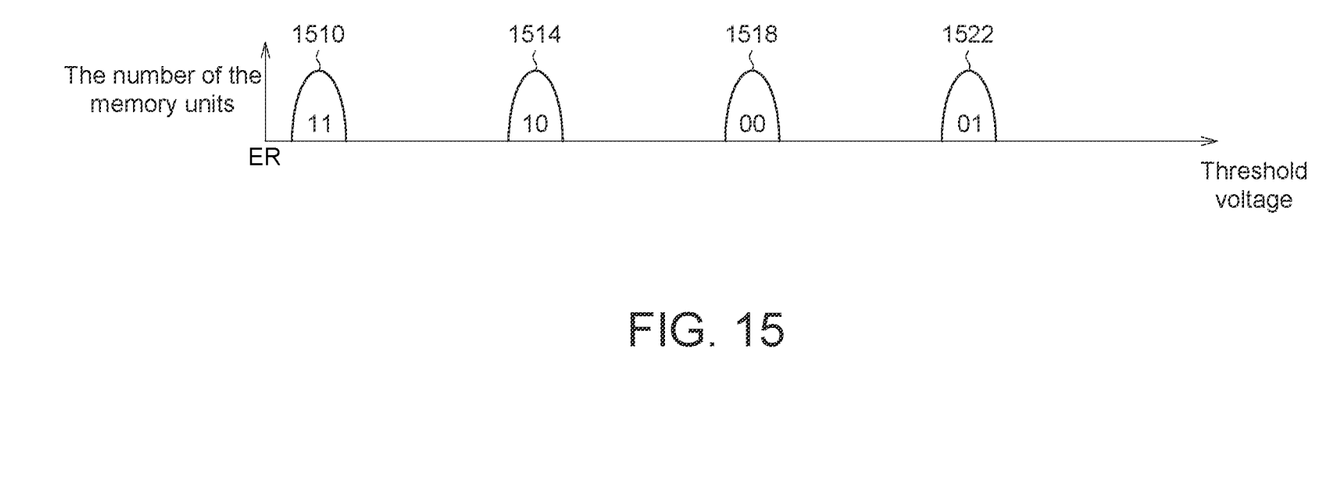
FIG. 15 shows a schematic diagram of the data stored in MLC memory unit and the distributions of threshold voltage according to yett another embodiment of the present disclosure.

Referring to FIG. 13, FIG. 13 shows a flowchart of operation method of memory device according to another embodiment of the present disclosure.

At step S1301, the memory controller receives a write request and a first data from the external host controller.

At step S1302, the memory controller determines the number of bits to be written per memory unit (i.e., the first parameter) requested by the write request. If the first parameter is N, performing S1303, the memory controller transmits a write command indicating N bits to be written per memory unit to the control logic circuit, and transmits the first data to be written to the control logic circuit; if the first parameter is K (K is an positive integer smaller than N), performing S1304, the memory controller transmits a write command indicating K bits to be written per memory unit to the control logic circuit, and transmits the first data to be written to the control logic circuit.

At step S1305, the control logic circuit configured the first data to be written as sub-data every N bits, and stores the sub-data into at least one buffer.

At step S1306, the control logic circuit configures the first data to be written as sub-data every K bit(s), stores the sub-data into the buffer, generates a (N−K)-bit pseudo data corresponding to each of the pseudo data, and stores the pseudo data to the buffer.

At step S1307, for each of the memory units to be programmed, the control logic circuit, according to the N-bit sub-data to be written into the memory unit stored in the buffer, programs the memory unit to modify the threshold voltage of the memory unit to cause the threshold voltage of the memory unit to fall within one of $2^N$ voltage ranges.

At step S1308, for each of the memory units to be programmed, the control logic circuit, according to the K-bit sub-data to be written into the memory unit and the (N−K)-bit pseudo data corresponding to the K-bit sub-data to be written into the memory unit stored in the buffer, programs the memory unit to modify the threshold voltage of the memory unit to cause the threshold voltage of the memory unit to fall within one of $2^K$ voltage ranges selected from the $2^N$ voltage ranges.

Noted that the $2^N$ voltage ranges are one-to-one corresponding to the $2^N$ data patterns formed by N bits of binary data. The $2^K$ voltages ranges selected from the $2^N$ voltage ranges could be predetermined and recorded in the control logic circuit. In an embodiment, the $2^K$ voltages ranges selected from the $2^N$ voltage ranges are discontinuous. That is, there is at least one of unselected voltage range between any two of the selected voltage ranges, for example, the embodiments in FIGS. 7, 8, 10, 11, 12, in order to reduce the probability of reading error. In different embodiment, the $2^K$ voltages ranges selected from the $2^N$ voltage ranges are continuous or partially continuous, for example, an embodiment that selects the distributions 610, 620 from the distributions 61ER~680 in FIG. 6 to correspond 0 and 1 for SLC programming.

Noted that the number of the buffers could be one or more, and the present disclosure is not limited.

With the present disclosure, for the memory device supports at N bits to be written per memory unit, the space for (N−1) sets of control logic circuits could be saved.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A memory device, comprising:
a memory controller, configured to receive a write request and a first data from a host controller, and transmit a write command indicating a first parameter, wherein the first parameter represents the number of bits of binary data to be written into one memory unit; and
a memory, coupled to the memory controller, comprising:

a memory array, comprising a plurality of memory units, each of the memory units configured to store at most N bits of binary data, wherein N is an integer greater than 1;

at least one buffer; and a control logic circuit, coupled to the memory array and the at least one of buffer, and configured to perform:

in response to the write command, when the first parameter is K which is an positive integer smaller than N, configuring the first data as sub-data every K bit(s), generating a (N–K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N–K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

2. The memory device according to claim 1, wherein the $2^K$ voltage ranges selected from the $2^N$ voltage ranges are discontinuous.

3. The memory device according to claim 1, wherein N is 3, K is 2, and the control logic circuit input each of the sub-data into a XNOR gate to generate the pseudo data corresponding to each of the sub-data.

4. The memory device according to claim 1, wherein N is 3, K is 1, and the pseudo data corresponding to each of the sub-data generated by the control logic circuit is two-bit binary data 11.

5. The memory device according to claim 1, wherein the control logic circuit is further configured to perform:

in response to the write command, when the first parameter is N, configuring the first data as sub-data every N bit(s), and storing the sub-data into the at least one buffer; and for each of the memory units to be programmed, programing the memory unit according to the N-bit sub-data to be written into the memory unit, to cause a threshold voltage of the memory unit to fall within one of the $2^N$ voltage ranges.

6. An operation method of memory device, comprising:

receiving a write request and a first data from a host controller;

transmitting a write command indicating a first parameter, wherein the first parameter represents the number of bits of binary data to be written into one memory unit, each memory unit is configured to store at most N bits of binary data, and N is an integer greater than 1;

in response to the write command, when the first parameter is K which is an positive integer smaller than N, configuring the first data as sub-data every K bit(s), generating a (N–K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N–K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

7. The operation method according to claim 6, wherein the $2^K$ voltage ranges selected from the $2^N$ voltage ranges are discontinuous.

8. The operation method according to claim 6, wherein N is 3, K is 2, and each of the sub-data is input into a XNOR gate to generate the pseudo data corresponding to each of the sub-data.

9. The operation method according to claim 6, wherein N is 3, K is 1, and the pseudo data corresponding to each of the sub-data is two-bit binary data 11.

10. The operation method according to claim 6, further comprising:

in response to the write command, when the first parameter is N, configuring the first data as sub-data every N bit(s), and storing the sub-data into the at least one buffer; and for each of the memory units to be programmed, programing the memory unit according to the N-bit sub-data to be written into the memory unit, to cause a threshold voltage of the memory unit to fall within one of the $2^N$ voltage ranges.

11. A memory chip, comprising:

a memory array, comprising a plurality of memory units, each of the memory units configured to store at most N bits of binary data, wherein N is an integer greater than 1;

at least one buffer; and a control logic circuit, coupled to the memory array and the at least one of buffer, and configured to perform:

receiving a write command and a first data from a memory controller, wherein the write command indicates a first parameter, the first parameter represents the number of bits of binary data to be written into one memory unit;

in response to the write command, when the first parameter is K which is an positive integer smaller than N, configuring the first data as sub-data every K bit(s), generating a (N–K)-bit pseudo data corresponding to each of the sub-data, and storing the sub-data and the pseudo data into the at least one buffer; and for each of the memory units to be programmed, programing the memory unit according to the K-bit sub-data to be written into the memory unit and the (N–K)-bit pseudo data corresponding to the sub-data to be written into the memory unit, to cause a threshold voltage of the memory unit to fall within one of $2^K$ voltage ranges selected from $2^N$ voltage ranges, wherein the $2^N$ voltage ranges one-to-one corresponding to $2^N$ data patterns formed by N bits of binary data.

12. The memory chip according to claim 11, wherein the $2^K$ voltage ranges selected from the $2^N$ voltage ranges are discontinuous.

13. The memory chip according to claim 11, wherein N is 3, K is 2, and the control logic circuit input each of the sub-data into a XNOR gate to generate the pseudo data corresponding to each of the sub-data.

14. The memory chip according to claim 11, wherein N is 3, K is 1, and the pseudo data corresponding to each of the sub-data generated by the control logic circuit is two-bit binary data 11.

15. The memory chip according to claim 11, wherein the control logic circuit is further configured to perform:

in response to the write command, when the first parameter is N, configuring the first data as sub-data every N bit(s), and storing the sub-data into the at least one buffer; and for each of the memory units to be programmed, programing the memory unit according to the N-bit sub-data to be written into the memory unit, to cause a threshold voltage of the memory unit to fall within one of the $2^N$ voltage ranges.

\* \* \* \* \*